United States Patent
Omura

(10) Patent No.: US 7,023,133 B2
(45) Date of Patent: Apr. 4, 2006

(54) ELECTROLUMINESCENT DISPLAY DEVICE WITH STRESS BUFFERING LAYER

(75) Inventor: Tetsuji Omura, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 260 days.

(21) Appl. No.: 10/623,799

(22) Filed: Jul. 22, 2003

(65) Prior Publication Data

US 2004/0135500 A1 Jul. 15, 2004

(30) Foreign Application Priority Data

Jul. 22, 2002 (JP) ............................. 2002-211870

(51) Int. Cl.
*H05B 33/00* (2006.01)

(52) U.S. Cl. ..................................... 313/512

(58) Field of Classification Search ......... 313/501–512
See application file for complete search history.

(56) References Cited

U.S. PATENT DOCUMENTS

2004/0032207 A1* 2/2004 Sasatani et al. ............. 313/506

* cited by examiner

*Primary Examiner*—Joseph Williams
(74) *Attorney, Agent, or Firm*—Morrison & Foerster LLP

(57) ABSTRACT

The invention prevents a desiccant layer in an organic EL display panel from peeling off and enhances reliability in resistance to a temperature cycle. A device glass substrate is attached to a sealing glass substrate for sealing devices with sealing resin made of epoxy resin etc. The sealing glass substrate is formed with a pocket portion by etching. An Al layer having a thickness of about 4000 Å is formed on a bottom of the pocket portion by an evaporation method, serving as a stress buffering layer. A desiccant layer for absorbing moisture is coated on the Al layer.

21 Claims, 5 Drawing Sheets

ELECTROLUMINESCENT DISPLAY DEVICE WITH STRESS BUFFERING LAYER

BACKGROUND OF THE INVENTION

1. Field of the Invention

The invention relates to a sealing structure of an electroluminescent display device for improving moisture resistance.

2. Description of the Related Art

In recent years, organic electroluminescent (hereafter, referred to as EL) display devices with organic El elements, which are a self-emission device, has been receiving an attention as a new display device replacing CRT and LCD displays.

Since the organic El element is sensitive to moisture, in an organic EL display panel, a structure in which the organic El element is covered with a metal cap or a glass cap coated with a desiccant has been proposed. FIG. 6 is a cross-sectional view showing such a conventional structure of the organic EL display panel.

A device glass substrate 70 has a display region having many organic El elements 71 on its surface. The device glass substrate 70 is attached to a sealing glass substrate 80 for sealing the devices with sealing resin 75 made of an epoxy resin or the like. The sealing glass substrate 80 has a concave portion 81 (hereafter, referred to as a pocket portion 81) in a region corresponding to the display region, which is formed by etching. The pocket portion 81 is coated with a desiccant layer 82 for absorbing moisture on its bottom.

Here, forming of the desiccant layer 82 on the bottom of the pocket portion 81 is for securing a space between the desiccant layer 82 and the organic El element 71. This structure prevents the desiccant layer 82 from contacting the organic El element 71 and thus from damaging the organic El element 71.

It is necessary for the organic EL display panel to secure moisture resistance as well as reliability in resistance to temperature changes. We performed a temperature cycling test on organic EL panels, in which the temperature is raised and reduced in a cycle repeatedly. It was found that the desiccant layer 82 partially peeled off and came away from the sealing glass substrate 80 as shown in FIG. 7. It was also found that the desiccant layer 82 was partially peeled and torn and the torn portion 82A of the desiccant layer 82 rested between the desiccant layer 82 and the device glass substrate 70. If these peeling off events happen, it is likely that the organic EL element 71 is damaged

SUMMARY OF THE INVENTION

We studied the above peeling off events and found that in the course of reducing the panel temperature after from an elevated temperature, a large stress contraction occurs in the desiccant layer which has a higher thermal expansion coefficient than the sealing glass substrate. Especially, the difference in the thermal expansion coefficient causes stressed to be focused onto the contact surface of the desiccant layer. When the stresses are higher than the adhesive strength between the desiccant layer and the sealing glass substrate, the desiccant layer peels off from the sealing substrate. This sometimes results in the tear of the desiccant layer.

The invention provides an electroluminescent display device that includes a device substrate provided with an electroluminescent element, a sealing substrate attached to the device substrate, a desiccant layer disposed on the sealing substrate, and a stress buffering layer disposed between the sealing substrate and the desiccant layer and configured to relieve stresses generated between the sealing substrate and the desiccant layer.

The invention also provides an electroluminescent display device that includes a device substrate provided with an electroluminescent element, a sealing substrate attached to the device substrate, a pocket portion formed on the surface of the sealing substrate, a desiccant layer disposed in the pocket portion, and a stress buffering layer disposed between the sealing substrate and the desiccant layer and configured to relieve stresses generated between the sealing substrate and the desiccant layer.

The invention further provides an electroluminescent display device that includes a device substrate provided with an electroluminescent element, a sealing substrate attached to the device substrate, and a desiccant containing layer disposed on the sealing substrate and containing a desiccant. The coefficient of thermal expansion of the sealing substrate is $10 \times 10^{-6}$ or less, and the coefficient of thermal expansion of the desiccant containing layer is between $30 \times 10^{-6}$ and $40 \times 10^{-6}$.

DESCRIPTION OF THE PREFERRED EMBODIMENTS

Next, embodiments of the invention will be described with reference to the drawings in detail. First, a functional principle of the embodiments of the invention will be described with reference to FIGS. 1A and 1B.

Figure 1A:
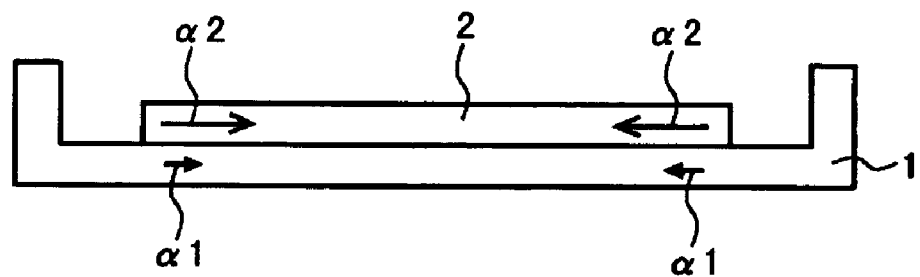
FIGS. 1A and 1B are schematic cross-sectional views of an electroluminescent display device for explaining a functional principle of the embodiments.

FIG. 1A is a schematic representation of a conventional structure, in which a desiccant layer 2 is directly coated on a bottom of a pocket portion provided on a surface of a sealing glass substrate 1. Suppose that the temperature of this structure is raised and then reduced. A thermal stress contraction occurs in the sealing glass substrate 1 and the desiccant layer 2. Since the coefficient of thermal expansion $\alpha 2$ of the desiccant layer 2 is generally higher than a coefficient of thermal expansion $\alpha 1$ of the sealing glass substrate 1, this difference generates stresses at a contact surface of the desiccant layer 2. If this stress is higher than the adhesive force between the desiccant layer 2 and the sealing glass substrate 1, the desiccant layer 2 peels off the sealing glass substrate 1.

Figure 1B:
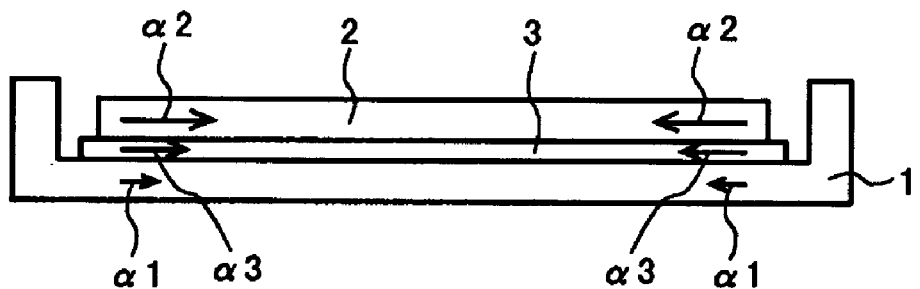

In this embodiment, a stress buffering layer 3 is inserted between the desiccant layer 2 and the sealing glass substrate 1, as schematically shown in FIG. 1B. The coefficient of thermal expansion α3 of the stress buffering layer 3 is preferably higher than the coefficient of thermal expansion α1 of the sealing glass substrate 1 and lower than the coefficient of thermal expansion α2 of the desiccant layer 2 (α1<α3<α2).

This condition makes the difference in the coefficient of thermal expansion between the desiccant layer 2 and the stress buffering layer 3 smaller. As a result, the stress generated in the desiccant layer 2 is lower than the stresses of the conventional structure without the stress buffer layer 3. This makes it difficult for the desiccant layer 2 to peel off the stress buffering layer 3. Furthermore, since the difference in the coefficient of thermal expansion between the stress buffering layer 3 and the sealing glass substrate 1 is made smaller, the stress buffering layer 3 also hardly peels off the sealing glass substrate 1. Accordingly, a sealing structure in which the desiccant layer 2 is prevented from peeling off and is obtained.

Figure 2:
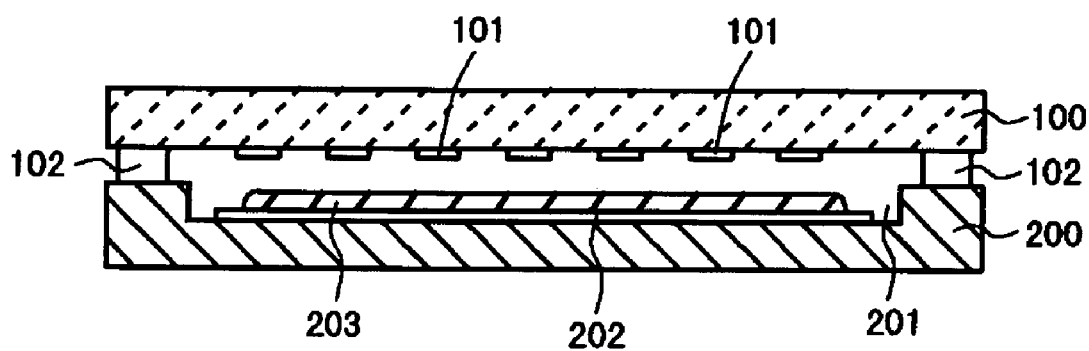
FIG. 2 is a cross-sectional view of an electroluminescent display device according to a first embodiment of the invention.

Next, a display device according to a first embodiment of the invention will be described with reference to FIG. 2. A device glass substrate 100 has a display region having many organic El elements 101 on its surface. The device glass substrate 100 is approximately 0.7 mm in thickness. The structure of the organic El element 101 will be described later.

The device glass substrate 101 is attached to the sealing glass substrate 200 for sealing the devices with sealing resin 102 made of an epoxy resin or the like. The sealing glass substrate 200 is formed with a concave portion formed by etching, i.e. a pocket portion 201 in the region corresponding to the display region. An Al (aluminum) layer 202 having a thickness of about 4000 Å. is formed on the bottom of the pocket portion 201 by, for example, an evaporation method, serving as a stress buffering layer. The Al layer 202 is coated with a desiccant layer 203 for absorbing moisture.

The desiccant layer 203 is attached, for example, by coating on the Al layer 202 a solvent dissolved with powdered calcium oxide or barium oxide and resin as an adhesive, and then hardening the solvent by UV irradiation or heating. The desiccant layer 203 is, for example, 100 μm in thickness.

Here, the coefficients of thermal expansion α1, α2, and α3 respectively corresponding to the sealing glass substrate 200, the desiccant layer 203 and the Al layer 202 are close to or below approximately $10\times10^{-6}$, approximately $100\times10^{-6}$, and approximately $30\times10^{-6}$, respectively. That is, the relationship of α1<α3<α2 is satisfied. The Al layer 202 has strong adhesion to the sealing glass substrate 200 and the desiccant layer 203. Therefore, the structure of FIG. 2 prevents the desiccant layer 203 from peeling off.

Although the Al layer 202 is used as the stress buffering layer in this embodiment, Alq3 (8-tris-hydroxyquinoline aluminum) may be used instead. As long as the relationship of α1<α3<α2 is satisfied, the material of the stress buffering layer is not limited to Al, but other metals may be used.

Furthermore, the material of the stress buffering layer is not limited to metals, but may be organic materials such as PI (polyimide). Although the coefficient of thermal expansion of PI is approximately $90\times10^{-6}$ to $100\times10^{-6}$ and is not lower than that of the desiccant layer 203 by a large amount, the adhesive force between the PI layer and the sealing glass substrate 200 is higher than that between the desiccant layer 203 and the sealing glass substrate 200. Therefore, the PI layer hardly peels off the sealing substrate 200 and the desiccant layer 203 on the PI layer hardly peels off, thereby relieving the stress generated by the thermal expansion.

Figure 3A:
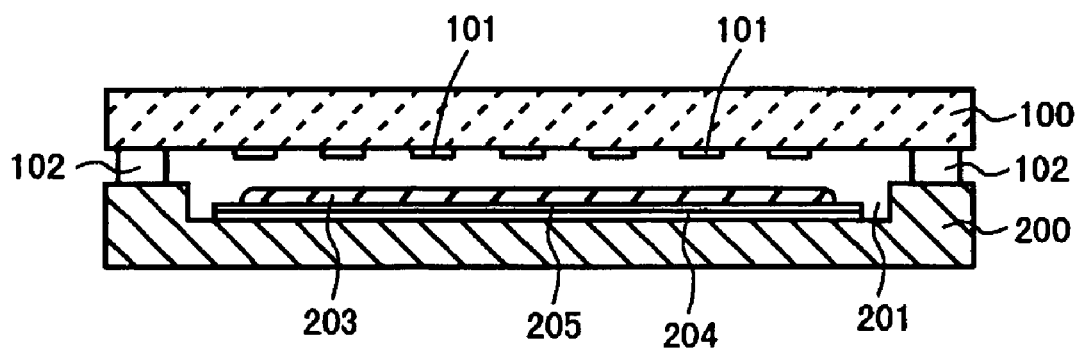
FIGS. 3A and 3B are cross-sectional views of an electroluminescent display device according to a second embodiment of the invention.

A display device according to a second embodiment of the invention will be described with reference to FIG. 3A. In this display device, the stress buffering layer has two layers of different materials. That is, a second stress buffering layer 205 is laminated on a first stress buffering layer 204, and the desiccant layer 203 is formed thereon. This enhances flexibility of designing stress buffering functions of the device.

Specifically, in this embodiment, the stress buffering layer is formed by laminating any of two layers among the Al layer, the Alq3 layer and the PI layer, which are described above. That is, the stress buffering layer has a laminating structure of the Al layer and the Alq3 layer, the Al layer and the PI layer, or the Alq3 layer and the PI layer.

The stress buffering layer is not limited to the two-layered structure, but may be a lamination of three or more layers of different materials. Any of the structures can be adapted as long as the relationship of α1<α3<α2 is satisfied when α1, α3, and α2 are the coefficients of thermal expansion of the sealing glass substrate, the stress buffering layer, and the desiccant layer, respectively.

Figure 3B:
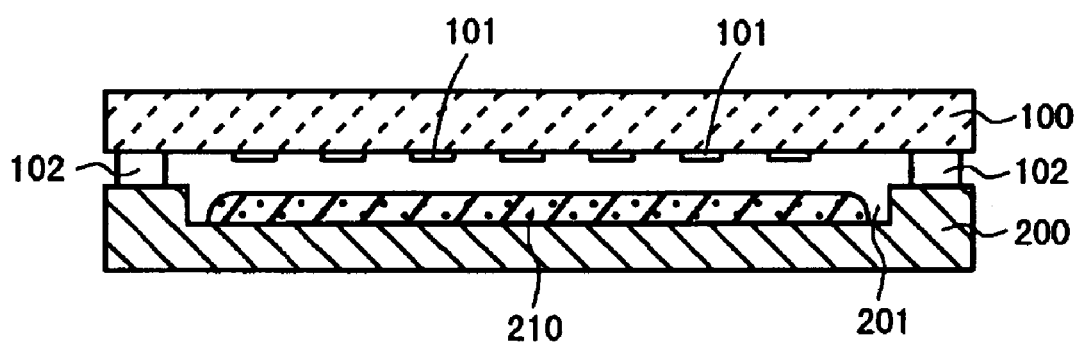

A display device according to a third embodiment of the invention will be described with reference to FIG. 3B. In this display device, the pocket portion 201 is formed on the sealing glass substrate 200, and a desiccant containing layer 210 containing a desiccant is formed on the pocket portion 201. This desiccant containing layer 210 is formed by mixing a desiccant such as powdered calcium oxide and barium oxide with a material layer used as a stress buffering layer, for example, an aluminum layer, a polyimide layer or an Alq3 layer. The coefficient of thermal expansion of the sealing glass substrate 200 is $10\times10^{-6}$ or less, and a coefficient of thermal expansion of the desiccant containing layer 210 is between $30\times10^{-6}$ and $40\times10^{-6}$. Since the desiccant containing layer 210 is substantially made of the material of the stress buffering layer, the coefficient of thermal expansion is relatively low. Therefore, the coefficient of thermal expansion of the desiccant containing layer 210 is close to the coefficient of thermal expansion of the sealing glass substrate 200 so that the desiccant containing layer 210 hardly peels off the sealing substrate 200. Furthermore, the desiccant containing layer 210 contains a desiccant, thereby also functioning as a desiccant layer. The desiccant containing layer 210 may be transparent.

Figure 4:
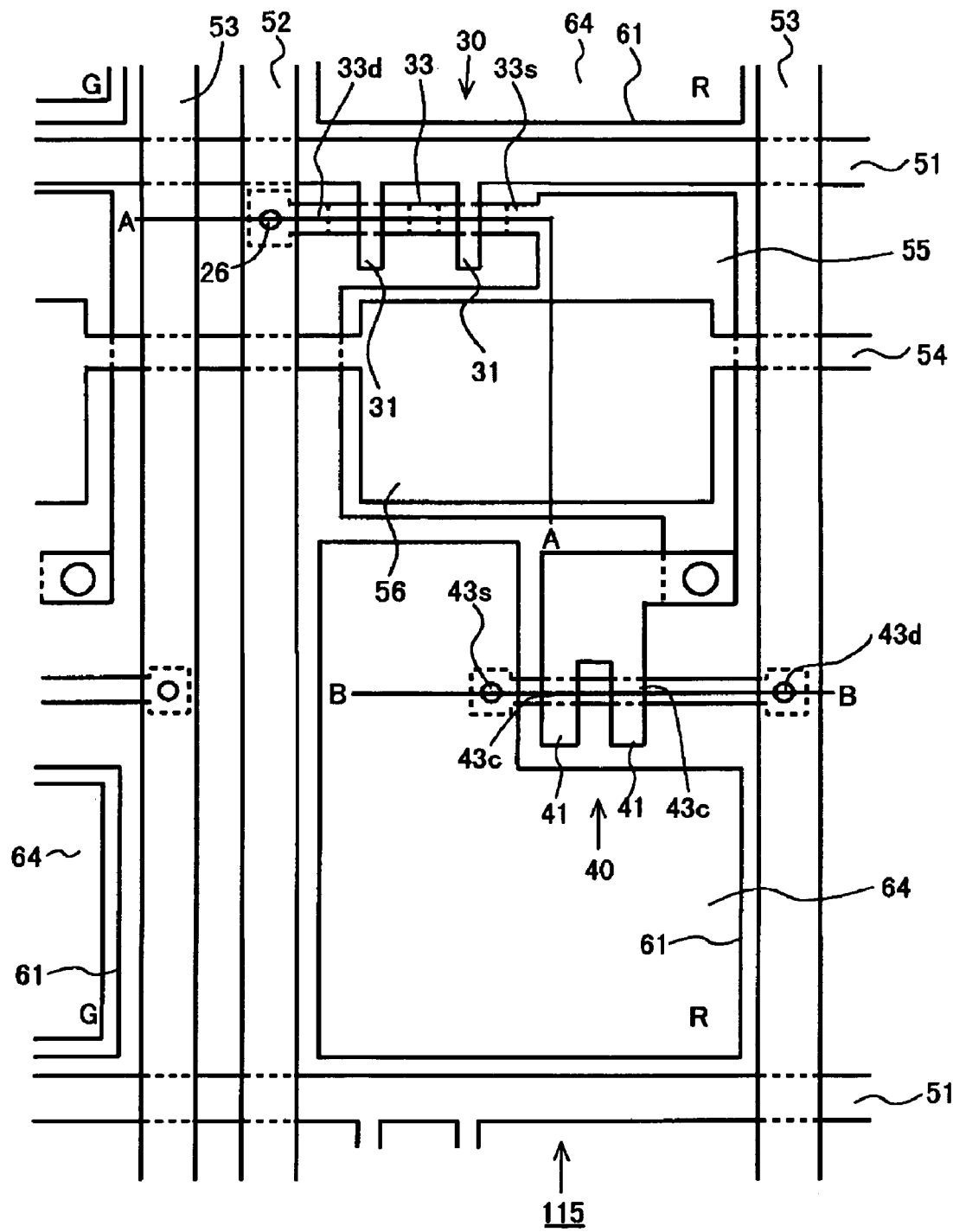
FIG. 4 is a plan view of a pixel of the organic electroluminescent display devices of the first, second and third embodiments.

Next, the structure of the organic EL elements used in the first, second and third embodiments will be described. FIG. 4 is a plan view of a pixel of an organic EL display device, FIG. 5A is a cross-sectional view along line A—A of FIG. 4, and FIG. 5B is a cross-sectional view along line B—B of FIG. 4.

Figure 5A:
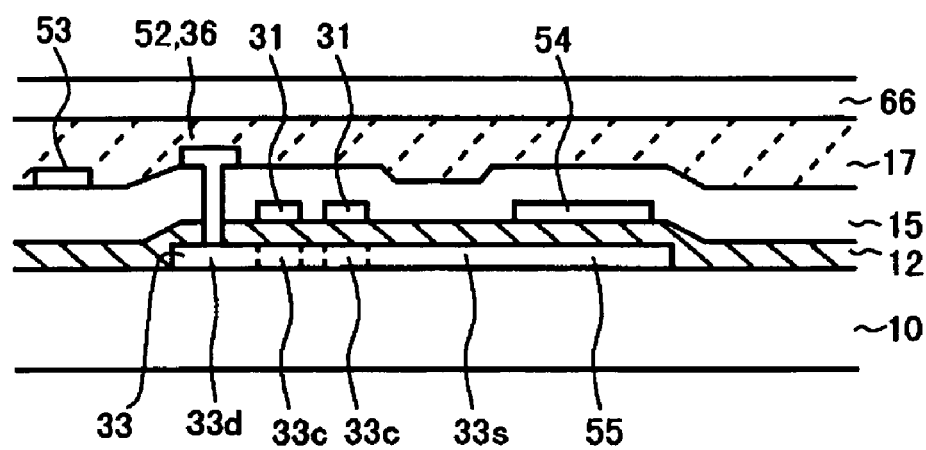
FIGS. 5A and 5B are cross-sectional views of a pixel of the organic electroluminescent display device of FIG. 4.
Figure 5B:
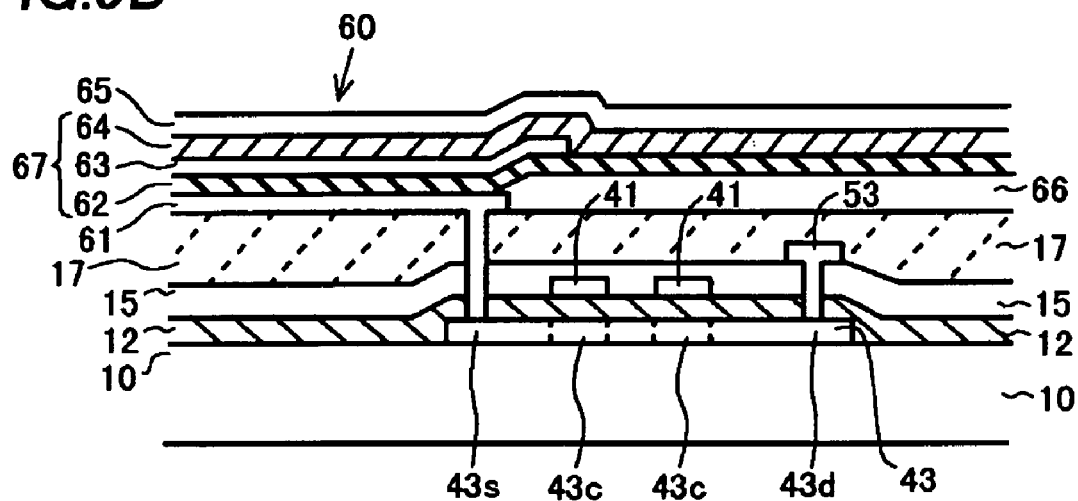
Figure 6:
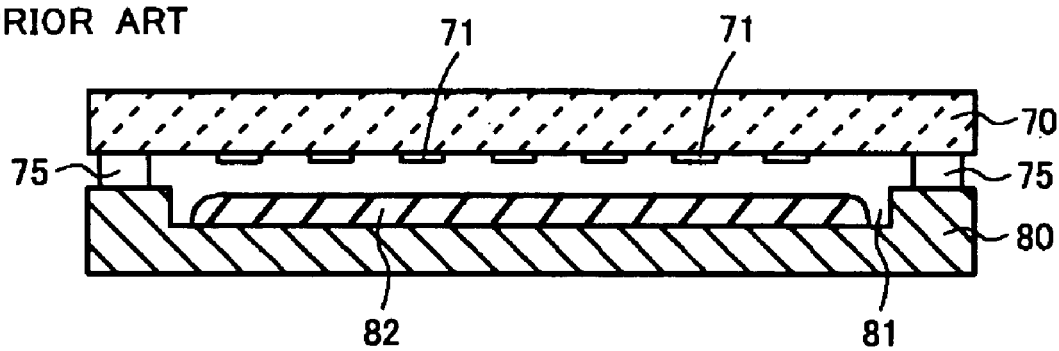
FIG. 6 is a cross-sectional view of a conventional electroluminescent display device.
Figure 7:
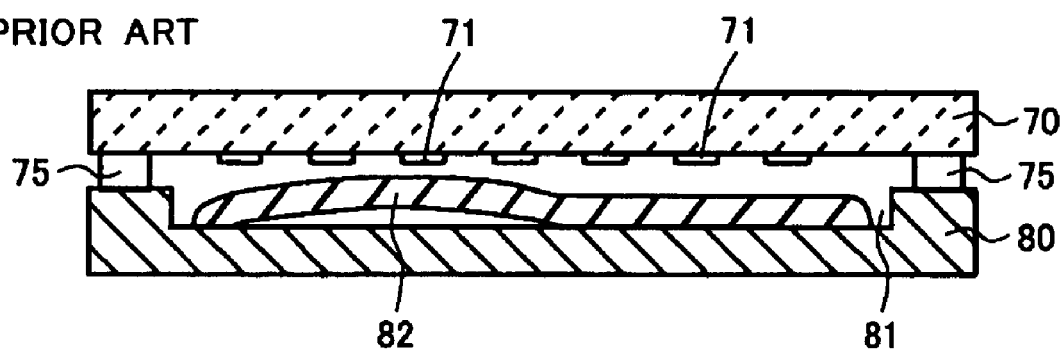
FIG. 7 is a cross-sectional view of the electroluminescent display device of FIG. 6 when a portion of a desiccant layer peels off due to generation of thermal stresses.
Figure 8:
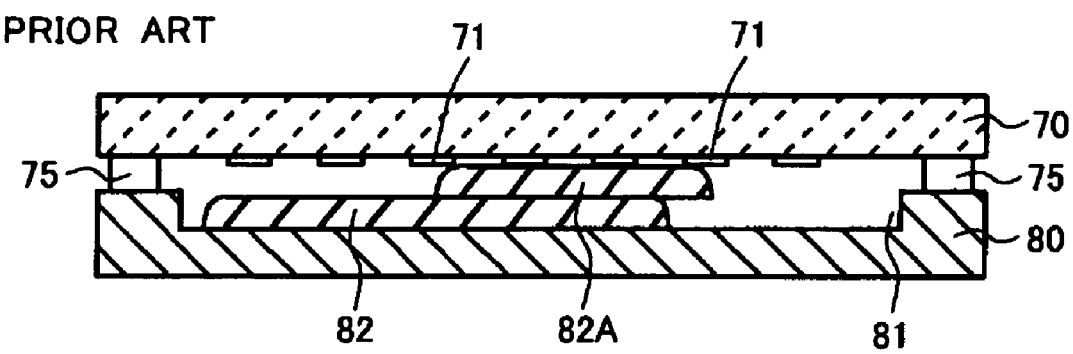
FIG. 8 is a cross-sectional view of the electroluminescent display device of FIG. 6 when a portion of the desiccant layer is torn.

As shown in FIGS. 4, 5A and 5B, a pixel 115 is formed in a region surrounded by a gate signal line 51 and a drain signal line 52. A plurality of the pixels 115 is disposed in a matrix.

An organic El element 60 as a self-emission device, a switching TFT (thin film transistor) 30 for controlling a timing of supplying an electric current to the organic El element 60, a driving TFT 40 for supplying an electric current to the organic El element 60 and a storage capacitor are disposed in the pixel 115. The organic El element 60 is formed of an anode 61, an emissive layer 67 made of an emission material and a cathode 65.

The switching TFT 30 is provided in a periphery of the intersection of the signal lines 51 and 52. A source 33s of the switching TFT 30 serves as a capacitor electrode 55 for forming a capacitor with a storage capacitor electrode line 54 and is connected to a gate electrode 41 of the driving TFT 40. A source 43s of the driving TFT 40 is connected to the anode 61 of the organic El element 60, while a drain 43d is connected to a driving source line 53 as a current source to be supplied to the organic El element 60.

The storage capacitor electrode line 54 is positioned in parallel with the gate signal line 51. The storage capacitor electrode line 54 is made of chromium (Cr) or the like and forms a capacitor by storing an electric charge with the capacitor electrode 55 connected to the source 33s of the TFT 30 through a gate insulating film 12. A storage capacitor 56 is provided for storing voltage applied to the gate electrode 41 of the driving TFT 40.

As shown in FIGS. 5A and 5B, the organic EL display device is formed by laminating the TFTs and the organic El element sequentially on a substrate 10 such as a substrate made of a glass or a synthetic resin, a conductive substrate or a semiconductor substrate. When using a conductive substrate or a semiconductor substrate as the substrate 10, however, an insulating film such as $SiO_2$ or $SiN_x$ is formed on the substrate 10, and then the switching TFT 30, the driving TFT 40 and the organic El element 60 are formed thereon. Each of the two TFTs has a so-called top gate structure in which a gate electrode is placed above an active layer with a gate insulating film being interposed therebetween.

The switching TFT 30 will be described first. As shown in FIG. 5A, an amorphous silicon film (hereafter, referred to as an a-Si film) is formed on the insulating substrate 10 made of a silica glass, a non-alkali glass or the like by a CVD method or the like. The a-Si film is irradiated by laser beams for melting and recrystallization to form a poly-silicon film (hereafter, referred to as a p-Si film) as an active layer 33. On the active layer 33, a single-layer or a multi-layer of an $SiO_2$ film and an $SiN_x$ film is formed as the gate insulating film 12. There are formed on the gate insulating film 12 the gate signal line 51 made of a metal having a high melting point such as Cr or Mo (molybdenum) and also serving as a gate electrode 31, the drain signal line 52 made of Al, and the driving source line 53 made of Al and serving as a driving source of the organic El element.

An interlayer insulating film 15 laminated with an $SiO_2$ film, an $SiN_x$ film and an $SiO_2$ film sequentially is formed on the whole surfaces of the gate insulating film 12 and the active layer 33. There is provided a drain electrode 36 by filling metal such as Al in a contact hole provided correspondingly to a drain 33d. Furthermore, a planarization insulating film 17 for planarizing a surface, which is made of an organic resin, is formed on the whole surface.

Next, there will be described the driving TFT 40 of the organic El element. As shown in FIG. 5B, an active layer 43 formed by poly-crystalizing an a-Si film by laser irradiation, the gate insulating film 12, and the gate electrode 41 made of a metal having a high melting point such as Cr or Mo are formed sequentially on the insulating substrate 10 made of a silica glass, a non-alkali glass or the like. There are provided in the active layer 43 a channel 43c, and a source 43s and a drain 43d on both sides of the channel 43c. The interlayer insulating film 15 laminated with an $SiO_2$ film, an $SiN_x$ film and an $SiO_2$ film sequentially is formed on the whole surfaces of the gate insulating film 12 and the active layer 43. The driving source line 53 connected to a driving source by filling a metal such as Al in a contact hole provided correspondingly to a drain 43d is disposed. Furthermore, a planarization insulating film 17 for planarizing a surface, which is made of, for example, an organic resin or the like is formed on the whole surface. A contact hole is formed in a position corresponding to a source 43s in the planarization insulating film 17. A transparent electrode made of ITO (Indium Tin Oxide) and contacting the source 43s through the contact hole, i.e., the anode 61 of the organic El element is formed on the planarization insulating film 17. The anode 61 is formed in each of the pixels, being isolated as an island.

The organic El element 60 includes the anode 61 made of a transparent electrode such as ITO, a hole transport layer 62 having a first hole transport layer made of CuPc (Copper (II) phthalocyanine) and a second hole transport layer made of NPB (N, N'-Di (naphthalene-1-yl)-N,N'-diphenyl-benzidine), an emissive layer 63 made of Alq3 containing a quinacridone derivative, an electron transport layer 64 made of Alq3, and a cathode 65 made of magnesium-indium alloy, Al or Al alloy.

The planarization insulating film 17 is formed with a second planarization insulating film 66 thereon to prevent a short circuit between the anode 61 and the cathode 65. The second planarization insulating film 66 is removed on the anode 61.

In the organic El element 60, a hole injected from the anode 61 and an electron injected from the cathode 65 are recombined in the emissive layer 63 and an exciton is formed by exciting the organic module forming the emissive layer 63. Light is emitted from the emissive layer 63 in a process of radiation of the exciton and then released outside after going through the transparent anode 61 and the transparent insulating substrate 10, thereby to complete a light-emission.

What is claimed is:

1. An electroluminescent display device comprising:
   a device substrate provided with an electroluminescent element;
   a sealing substrate attached to the device substrate;
   a desiccant layer disposed on the sealing substrate; and
   a stress buffering layer disposed between the sealing substrate and the desiccant layer and configured to relieve stresses generated between the sealing substrate and the desiccant layer.

2. The electroluminescent display device of claim 1, wherein the coefficient of thermal expansion of the stress buffering layer is higher than the coefficient of thermal expansion of the sealing substrate and lower than the coefficient of thermal expansion of the desiccant layer.

3. The electroluminescent display device of claim 1, wherein the stress buffering layer comprises a layer made of aluminum.

4. The electroluminescent display device of claim 1, wherein the stress buffering layer comprises a layer made of Alq3.

5. The electroluminescent display device of claim 1, wherein the stress buffering layer comprises a layer made of polyimide.

6. The electroluminescent display device of claim 1, wherein the stress buffering layer comprises a layer made of aluminum and a layer made of Alq3.

7. The electroluminescent display device of claim 1, wherein the stress buffering layer comprises a layer made of aluminum and a layer made of polyimide.

8. The electroluminescent display device of claim 1, wherein the stress buffering layer comprises a layer made of Alq3 and a layer made of aluminum.

9. The electroluminescent display device of claim 1, wherein the device substrate is made of an inorganic glass, a polymeric glass or a composite thereof.

10. The electroluminescent display device of claim 1, wherein the sealing substrate is made of an inorganic glass, a polymeric glass or a composite thereof.

11. An electroluminescent display device comprising:
a device substrate provided with an electroluminescent element;
a sealing substrate attached to the device substrate;
a pocket portion formed on a surface of the sealing substrate;
a desiccant layer disposed in the pocket portion; and
a stress buffering layer disposed between the sealing substrate and the desiccant layer and configured to relieve stresses generated between the sealing substrate and the desiccant layer.

12. The electroluminescent display device of claim 11, wherein the coefficient of thermal expansion of the stress buffering layer is higher than the coefficient of thermal expansion of the sealing substrate and lower than the coefficient of thermal expansion of the desiccant layer.

13. The electroluminescent display device of claim 11, wherein the stress buffering layer comprises a layer made of aluminum.

14. The electroluminescent display device of claim 11, wherein the stress buffering layer comprises a layer made of Alq3.

15. The electroluminescent display device of claim 11, wherein the stress buffering layer comprises a layer made of polyimide.

16. The electroluminescent display device of claim 11, wherein the stress buffering layer comprises a layer made of aluminum and a layer made of Alq3.

17. The electroluminescent display device of claim 11, wherein the stress buffering layer comprises a layer made of aluminum and a layer made of polyimide.

18. The electroluminescent display device of claim 11, wherein the stress buffering layer comprises a layer made of Alq3 and a layer made of aluminum.

19. The electroluminescent display device of claim 11, wherein the device substrate is made of an inorganic glass, a polymeric glass or a composite thereof.

20. The electroluminescent display device of claim 11, wherein the sealing substrate is made of an inorganic glass, a polymeric glass or a composite thereof.

21. An electroluminescent display device comprising:
a device substrate provided with an electroluminescent element;
a sealing substrate attached to the device substrate; and
a desiccant containing layer disposed on the sealing substrate and containing a desiccant,
wherein the coefficient of thermal expansion of the sealing substrate is $10 \times 10^{-6}$ or less, and the coefficient of thermal expansion of the desiccant containing layer is between $30 \times 10^{-6}$ and $40 \times 10^{-6}$.

* * * * *